United States Patent
Dutta et al.

(10) Patent No.: US 7,240,304 B2
(45) Date of Patent: Jul. 3, 2007

(54) METHOD FOR VOLTAGE DROP ANALYSIS IN INTEGRETED CIRCUITS

(75) Inventors: Arijit Dutta, New Delhi (IN); Anuj Singhania, Uttar Pradesh (IN)

(73) Assignee: Freescale Semiconductor, Inc., Austin, TX (US)

( * ) Notice: Subject to any disclaimer, the term of this patent is extended or adjusted under 35 U.S.C. 154(b) by 619 days.

(21) Appl. No.: 10/838,809

(22) Filed: May 4, 2004

(65) Prior Publication Data
US 2005/0257077 A1    Nov. 17, 2005

(51) Int. Cl.
*G06F 17/50* (2006.01)
(52) U.S. Cl. .................................. 716/4; 716/5; 716/6
(58) Field of Classification Search .................... 716/4, 716/5, 6
See application file for complete search history.

(56) References Cited

U.S. PATENT DOCUMENTS 5,787,011 A * 7/1998 Ko ................. 716/2
6,678,869 B2 * 1/2004 Ohkubo .......................... 716/6
6,937,971 B1 * 8/2005 Smith et al. ................... 703/18
2004/0249588 A1 * 12/2004 Shimazaki et al. ........... 702/66

OTHER PUBLICATIONS

Feng Wang and Shir-Shen Chang, Scalable Polynomial Delay Model for Logic and Physical Synthesis, International Conference on Chip Design Automation (ICDA) Conference 2000, Session 12 (available at http://www.ifip.or.at/con2000/icda-12-6.pdf.

* cited by examiner

*Primary Examiner*—Sun James Lin
(74) *Attorney, Agent, or Firm*—Charles Bergere

(57) ABSTRACT

A method for performing a voltage drop analysis in a logic circuit that takes into consideration voltage drop—current drain dependency. The voltage drop analysis helps in accurately estimating power requirements of the logic circuit, designing optimal power grids and performing accurate static timing analysis for the logic circuit. The logic circuit has a plurality of gates. The method generates polynomial models for the power consumption, delay and transition time of each gate in the logic circuit. Thereafter, the polynomial models are solved to determine the supply voltage available at each gate of the logic circuit. The supply voltage, thus determined, is used to perform voltage drop analysis.

22 Claims, 2 Drawing Sheets

METHOD FOR VOLTAGE DROP ANALYSIS IN INTEGRETED CIRCUITS

BACKGROUND OF THE INVENTION

The present invention relates to computer-aided design of integrated circuits, and, more particularly, to the estimation of the voltage drop in a system-on-chip(SoC) design.

The number of transistors used in a circuit is increasing exponentially with the development of improved fabrication techniques. At the same time, there has been a manifold increase in the complexity of the circuits that can be made. In the present state of art, an integrated circuit may have millions of transistors. Such complex circuits require the use of complex design tools to model circuit behavior accurately at the design stage.

An accurate prediction of circuit behavior at the design stage is important for the design and fabrication process to be economically viable. Design tools, popularly known as Electronic Design Automation (EDA) tools, are at present used for circuit designing at all levels—from the conceptualization of the design at a functional level to the layout and routing at the transistor level. These EDA tools are used to minimize the design costs, testing costs, time to market, etc. Further, the use of EDA tools enables a test engineer to test the logical/functional correctness of the layout at the fabrication stage.

A related feature of the circuit-designing process is the reusability of a circuit design or a part of a circuit design. Very often, circuit designers use previously designed and characterized logic blocks that perform a small function. For example, an 8-bit multiplier can be designed and characterized once and used in various circuits later. These logic blocks form libraries, which are a collection of logic blocks that perform different functions. When designing a circuit, a circuit designer may choose several different logic blocks from such libraries, and connect them together to realize a more complex function. The libraries also store various characteristics such as supply voltage, current drain, etc., associated with the logic blocks.

A few problems arise while realizing a larger function with smaller logic blocks from the library. For example, when fabricated, the actual behavior of a circuit may deviate from that predicted by the EDA tools. This is because when characterizing with the EDA tools, it is assumed that each of the gates in the logical blocks is supplied with the full supply voltage—Vdd. This, however, does not hold true in a large circuit, because the voltage is supplied through a large network of wires known as a power grid. There is an inevitable resistive drop in the power grid, known as the voltage drop or IR drop. The voltage drop implies that a voltage smaller than Vdd is available at the gates. The greater the distance of a gate from the voltage supply, the smaller is the supply voltage available at the gate.

To account for the voltage drop in a logic circuit, present generation EDA tools provide methods for the estimation of the maximum current drain at the gate level. These estimates are then used to estimate the voltage drop profile in the logic circuit. However, the current drain at a gate depends on its supply voltage and changes significantly with even small fluctuations in the supply voltage. Changes in the current drain, in turn, affect the voltage drop in the power grid, and hence, the supply voltage available at the gate. Therefore, the current drain and the voltage drop are interdependent, where the determination of one depends on the other, and vice versa.

Existing EDA tools do not consider the interdependence of the current drain and the voltage drop, thereby giving unsatisfactory results. For example, in the case of EDA tools for power estimation, while estimating power requirements with ideal supply voltages, it is assumed that all gates in the logic circuit operate at an ideal voltage. This assumption is, however, not valid in the case of a multi-million transistor SoC design.

In the case of power grid analyzer tools, voltage drop analysis is performed with the current values estimated using power estimation EDA tools. The power grid analyzer tools do not provide accurate results as they ignore the fact that the current consumption profile of the logic circuit changes with the fluctuations in the voltage drop.

In the case of Static Timing Analysis (STA) tools, the possibility of on-chip variation of temperature, voltage and process conditions is ignored. However, for Deep Sub-Micron (DSM) and Ultra Deep Sub-Micron (UDSM) designs, studies have shown that this on-chip variation, if ignored, can cause significant performance losses. This is due to the fact that the voltage drop causes the gates to switch slower than usual, introducing errors in the analysis. To accommodate for voltage variations, some of the present day STA tools allow the user to input a value of the supply voltage for each cell. However, relying on user inputs per cell is time-consuming, tedious, and the accuracy of the analysis depends on the accuracy of the voltage value provided by the user.

In light of the above discussion, there is a need for a tool that performs voltage drop analysis in a logic circuit, taking into consideration the interdependence between the voltage drop and the current drain.

BRIEF DESCRIPTION OF THE DRAWINGS

The following detailed description of the preferred embodiments of the invention will be better understood when read in conjunction with the appended drawings. The present invention is illustrated by way of examples and is not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method for performing voltage drop analysis that takes into account the voltage drop—current drain dependency in a logic circuit. The logic circuit has a plurality of gates. In an exemplary embodiment of the invention, the method generates polynomial models for the power consumption, delay and transition time of each gate in the logic circuit. Thereafter, the polynomial models are solved, to determine the supply voltage available at each gate of the logic circuit. The supply voltage, thus determined, is used to perform voltage drop analysis. The voltage drop analysis includes, but is not limited to, the determination of the following: voltage drop profile, power consumption, transition time at input of all gates, and voltage drop induced delay for the logic circuit.

Figure 1:
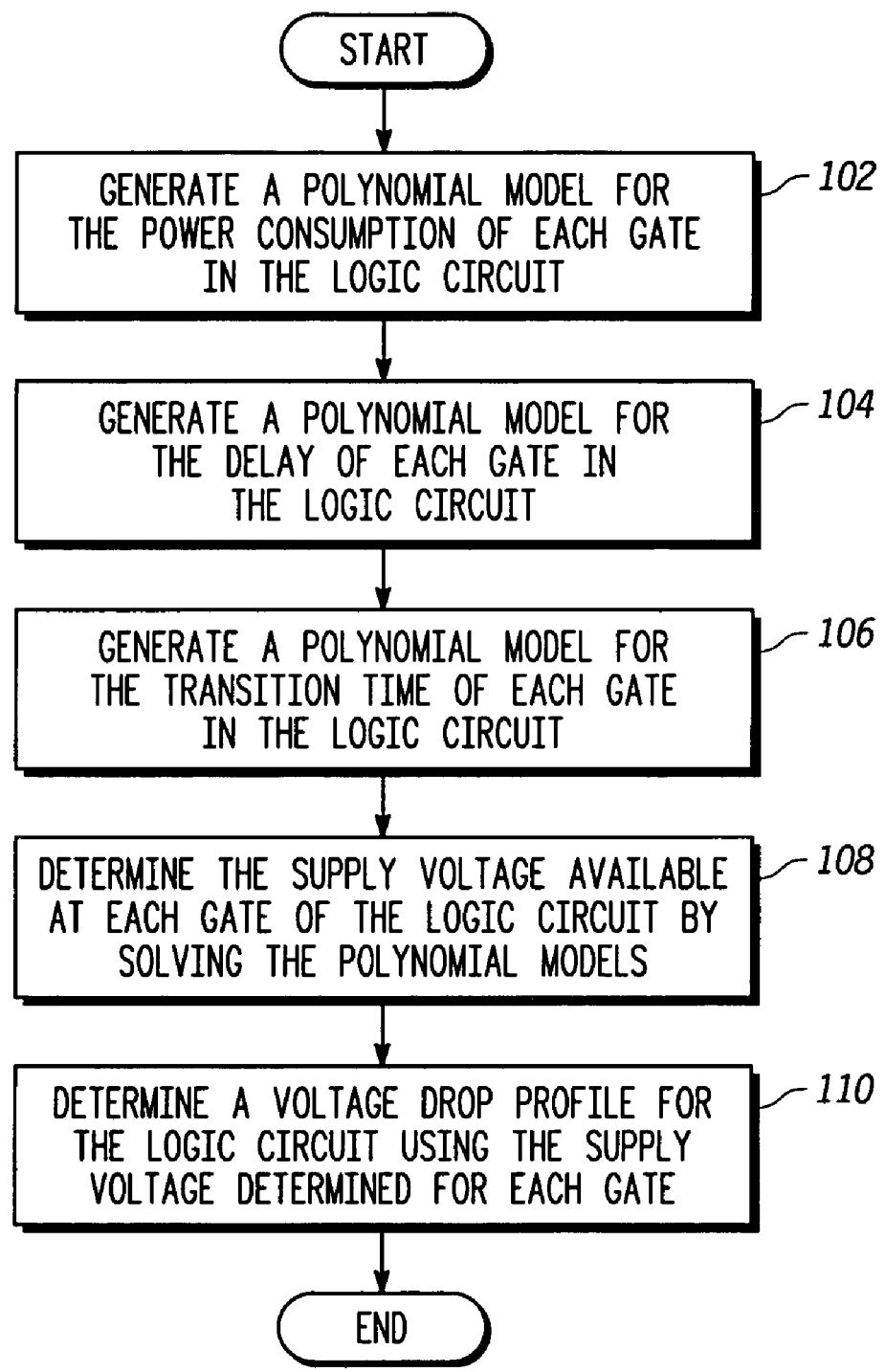
FIG. 1 is a flowchart illustrating a method for performing voltage drop analysis that takes into account the voltage drop—current drain dependency, according to an embodiment of the present invention.

FIG. 1 is a flowchart of the method for performing the voltage drop analysis, according to an embodiment of the present invention. The logic circuit has a plurality of gates. At step 102, a polynomial model for the power consumption of each gate in the logic circuit is generated. At step 104, a polynomial model for the delay of each gate in the logic circuit is generated. At step 106, a polynomial model for the transition time of each gate in the logic circuit is generated. Thereafter, at step 108, the polynomial models are solved together to determine the supply voltage available at each gate of the logic circuit. The supply voltage, thus determined, is used to determine a voltage drop profile of the logic circuit at step 110. The voltage drop profile includes the voltage drop values for each gate of the logic circuit. The voltage drop profile is used for the designing of optimal power grids, and the accurate estimation of the following: (i) the power consumption, (ii) the transition time at the input of all gates, and (iii) the voltage drop induced delay for the logic circuit.

Figure 2:
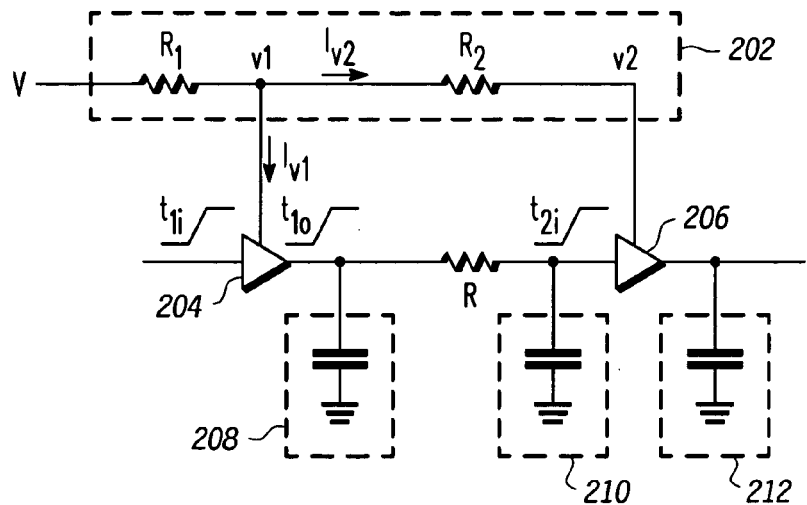
FIG. 2 illustrates an exemplary logic circuit that has been used to describe an ideal solution for the voltage drop analysis.

Having presented an overview, the various steps of the above method are hereinafter described in detail. For ease of understanding, the method is described using an exemplary circuit, shown in FIG. 2. The circuit shows a power grid 202 connected to two logic gates 204 and 206. The power grid 202 is supplied with a voltage V. The resistances of power grid 202 are $R_1$ and $R_2$. The logic gate 204 is connected to the logic gate 206 through a wire that's resistance is R. The input transition time for the logic gates 204 and 206, and the output transition time for the logic gate 206 are also shown in the figure. FIG. 2 also shows load capacitances 208, 210 and 212 of the circuit. Polynomial Models for estimating Power Consumption, Delay and the Transition Time are used.

In general, the power consumption of a gate is a function of supply voltage (v), input transition time $T_{xi}$, and output load $C_l$ at the gate. The polynomial model for power consumption P can be represented as:

$$P = f_1(v, C_l, T_{xi}) \quad \text{equation (1)}$$

In the equation given above, P is represented by a polynomial function f1 that involves three parameters—v, $C_l$ and $T_{xi}$. The supply voltage v is a variable parameter, and its value is affected by the voltage drop from the ideal voltage source V at the power grid. $C_l$ is the loading capacitance, and it represents the load in the logic circuit. $C_l$ is a known constant, and depends on the routing topology of the logic circuit.

To estimate the voltage drop in the logic circuit, current requirements for the gates are needed. The current requirements are obtained using the power consumption P and supply voltage v according to the following equation:

$$I_v = P/v = f_2(v, C_l, T_{xi}) \quad \text{equation (2)}$$

For instance, for the logic circuit shown in FIG. 2, the polynomial model for the current requirements of the logic circuit can be represented as:

$$I_{v1} = f_3(v1, C_l, T_{1i})$$

$$I_{v2} = f_4(v2, C_l, T_{2i}) \quad \text{equation set (3)}$$

The voltage drop for the logic circuit then is determined by the following equations, derived by applying Kirchoff's law:

$$V - v1 = R_1(I_{v1} + I_{v2})$$

$$v1 - v2 = R_2(I_{v2}) \quad \text{equation set (4)}$$

Resistances $R_1$ and $R_2$ are the resistances of the wires that are a part of the power grid mesh. The values of $R_1$ and $R_2$ can be extracted by using standard extraction tools known in the art. An example of such extraction tools is STARRC-XT from Synopsys, Inc.

The output transition time $T_{xo}$ is a polynomial function that depends on the parameters—supply voltage v, input transition time $T_{xi}$ and output load $C_l$ at the gate.

$$T_{xo} = f_5(v, T_{xi}, C_l) \quad \text{equation (5)}$$

The input transition time $T_{xi}$, at a gate n, depends on the output transition time of its preceding gate n-1.

$$T_{xi} = h(t) T_{xo} \quad \text{equation (6)}$$

In the equation given above, h(t) is the interconnect transfer function in the time domain, representing the transition degradation across an RC interconnect. h(t) is constant for a given routing topology. It can be computed in the frequency domain by using algorithms such as, but not limited to, PRIMA and Block Arnoldi. These algorithms are embedded in all timing analysis tools. To speed up simulation, h(t) can be ignored, i.e., its value is taken as one.

For instance, for the logic circuit shown in FIG. 2, the polynomial model for the transition times of the logic circuit can be represented as:

$$t_{1i} = \text{given constant}$$

$$t_{1o} = g_1(v1)$$

$$t_{2i} = h(t) t_{1o} \quad \text{equation set (7)}$$

Gate delays affect the number of gates switching at any point of time. It should be noted that neglecting the effect of the gate delays does not affect the average power consumption of a logic circuit over a simulation time period. However, for analyzing the transient behavior of the power grid, knowledge of the number of gates switching at any instant of time is required. Hence, gate delays play an important role in transient power grid analysis, and not in an average or DC analysis. In an exemplary embodiment, small variations in delay are modeled using small variations in the supply voltage. Therefore, the gate delay d can be modeled as a polynomial function of supply voltage v.

$$d = k(v) \quad \text{equation (8)}$$

The delay model described in equation (8) ignores the variation of transition time due to the changes in the supply voltage.

For the logic circuit shown in FIG. 2, gate delays for gates 204 and 206 can be represented as:

$$d_1 = k_1(v1)$$

$$d_2 = k_2(v2) \quad \text{equation set (9)}$$

The above equations 1-8 are solved together to obtain the values of power consumption, voltage drop, transition time and gate delay induced due to the voltage drop. There are a number of polynomial models available to determine power consumption, delay and transition times, such as SPDM/SPPM. The results from the polynomial solution of equations 1-8 are used to solve the equation 9 for delay deration.

By way of an example, the following equations are obtained by substituting the values of $I_{v1}$, and $I_{v2}$ from equation set 3 into equation set 4:

$$V-v1=R_1(f_3(v1, C_l, T_{1i})+f_4(v2, C_l, T_{2i}))$$

$$v1-v2=R_2(f_4(v2, C_l, T_{2i}))  \quad\quad \text{equation set (10)}$$

The following equation set is obtained by substituting the values of transition times from equation set 7 in equation set 10:

$$V-v1=R_1[F_1(v1, C_l)+f_4(v2, C_l, h(t)g_1(v1))]$$

$$v1-v2=R_2(f_4(v2, C_l, h(t)g_1(v1)))  \quad\quad \text{equation set (11)}$$

In the equation given above, $F_1$ is a polynomial function dependent on variable v1 and constant $C_l$. The equation set 11 has only two variable parameters that are supply voltage v1 and supply voltage v2. The equation set 11 can be solved by a standard polynomial solver to calculate the values of v1 and v2. The values of v1 and v2, thus obtained, can be substituted in equation 1, 4, 7 and 9 to obtain the values of power consumption, voltage drop, transition time and gate delay induced due to voltage drop, respectively.

It is relevant here to point out that for performing the voltage drop analysis, i.e., to determine power consumption, voltage drop, transition time and gate delay, one or more of the following information may be required: (i) parasitic load information, (ii) extracted power grid, (iii) standard cell placement information, (iv) activity information, (v) transition time at the primary pins and (vi) delay of cells and interconnects at ideal supply voltage. All of this information can be obtained using currently available EDA tools. A brief description of these terms is given below.

Activity Information: This input provides switching information of the gates in a logic circuit design.

Parasitic Load Information: The parasitic load is impedance (resistive and capacitive) of the routing interconnects. The greater the load, the greater will be the power consumption (i.e., the parasitic load) and the delay of the gate.

Extracted Power Grid: The extracted power grid is the parasitics information for each segment of the wires in a power grid mesh. The resistance information of the extracted power grid is used to estimate the voltage drop from an ideal supply to the gate supply.

Standard Cell Placement Information: This information is used to identify the voltage drop and ground bounce at the gate, and is used for calculating the gate delay. Voltage drop in a chip is a location-dependent phenomenon. The greater the distance of a gate from the ideal supply, the greater the voltage drop at the gate.

Transition time at the primary input pins: The transition time at the primary inputs depends on the application. Once this is known, the tools can estimate the transition time of the downward logic using the pre-characterized standard cell libraries. Standard tools, known in the art, have no mechanism of estimating the transition time of the signals at primary input pins. Hence, this information is provided by the user.

In another embodiment of the present invention, the method described above for the voltage drop analysis can be simplified further. This simplification makes the method less computationally intensive for estimating the values of power consumption, voltage drop, transition time and gate delay. The simplification is based on two assumptions that are stated below.

The first assumption is that the variation of power consumption with the transition time can be ignored for small changes in the supply voltage. Input transition time affects only the short-circuit current through a gate. The short-circuit current flows only when there exists a direct path from the vdd source to the ground. This necessitates a change of state for the PMOS and NMOS transistors that appear in the direct path. Since the switching current is at least an order greater than the short-circuit current, the effects of voltage variation on the short-circuit current can be ignored.

The second assumption is that the leakage power for the logic circuit is treated as a constant. The principal components of the leakage power are sub-threshold leakage and reverse bias junction current. When a gate switches, the leakage power is negligible, compared to the dynamic power consumption. When the gate is ideal, the leakage power dominates. Due to this leakage power, the logic circuit draws current for a long time. However, the magnitude of this current is typically at least two orders less than the switching current. Therefore, the leakage does not significantly affect the power grid. Moreover, the input stimuli vectors chosen for power estimation and power grid design are geared towards modeling the application functionality for maximal switching. For all vectors, the contribution of the leakage to the average power consumption is negligible. Hence, the leakage power consumption does not change significantly with small changes in the supply voltage, and can be ignored for power grid analysis.

Having stated the two assumptions, the simplified method is presented below, and is described with the help of an exemplary circuit shown in FIG. 3.

Figure 3:
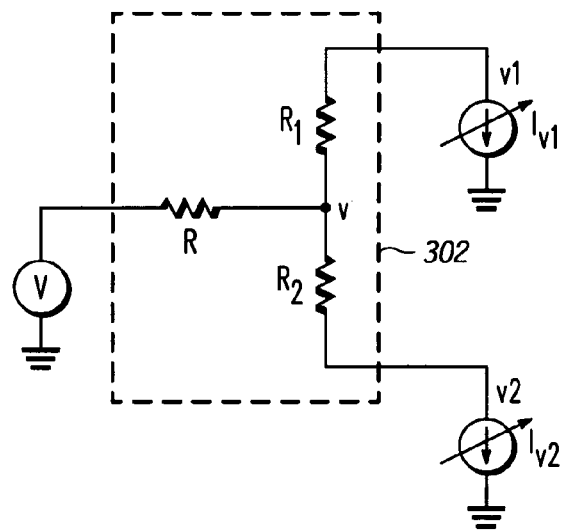
FIG. 3 illustrates another exemplary logic circuit that has been used to describe a simplified solution for the voltage drop analysis.

FIG. 3 illustrates another exemplary logic circuit that is used to describe the simplified method. FIG. 3 shows a power grid 302 connected to two voltage-dependent current sinks $I^{v1}$ and $I_{v2}$. The voltage-dependent current sinks represent the gates and their corresponding loads shown in FIG. 2. R, $R_1$ and $R_2$ are the effective resistances from the power supply source to the current sinks. v, v1 and v2 are intermediate node voltages. V is the ideal supply voltage.

It should be noted that the resistive network of the ground grid is ignored in FIG. 3. For ease of understanding, the ground grid is treated as ideal. However, it will be understood by one skilled in the art that the idea presented here can be extended to include the ground grid as well.

The current drawn from a power grid in a standard cell ($I_{v1}$ or $I_{v2}$) has the following components: (i) leakage current (corresponding to the sub-threshold and reverse bias current); and (ii) dynamic current (corresponding to the short circuit and switching current).

The capacitance of the circuit in FIG. 3 includes internal loads and the loads on the cell. The short-circuit current is the current drawn when there is a direct path from the supply to the ground of the cell during the transition time of the inputs.

Based on the above two assumptions, the total charging current for internal and external capacitors, can be represented as follows:

$$i = C\frac{dv}{dt}$$

The average charging/discharging current can be represented as:

$$I_{avg} = \frac{1}{T}\int_0^T i\,dt = \frac{1}{T}\int_0^v C\,dv = C\frac{v}{T} = kv \quad \text{equation (11)}$$

It can be inferred from equation 11 that the average charging/discharging current is linearly proportional to the supply voltage.

The following equations are obtained by applying Kirchoff's law on the circuit shown in FIG. 3:

$$V-v = (I_{v1}+I_{v2})R$$

$$v-v1 = (I_{v1})R_1$$

$$v-v2 = (I_{v2})R_2 \quad \text{equation set (12)}$$

Taking into consideration equation 11, equation set (12) and the two assumptions mentioned above, the following equations can be used to calculate $I_{v1}$ and $I_{v2}$:

$$I_{v1} = [(v1/V1)*I_1]+K1$$

$$I_{v2} = [(v2/V1)*I_2]+K2 \quad \text{equation set (13)}$$

In the above equation, $I_1$ and $I_2$ are the current components due to charging/discharging and internal power consumption; $K_1$ and $K_2$ are the current components due to leakage and short circuit power consumption; and V1 is the library voltage.

In accordance with the two assumptions, $K_1$ and $K_2$ are treated as constants in the simplified method. Hence, when the above equations (equations 11, 12 and 13) are solved using a linear solver, the values of the supply voltages obtained are close to those provided in the ideal method described in conjunction with FIG. 2.

Each of the above components ($I_1$, $I_2$, $K_1$ and $K_2$) can be obtained from standard power estimation tools known in the art. A few examples of these tools include PrimePower from Synopsys, Inc., and PowerTheater from Sequence Design, Inc.

The supply voltages thus obtained can then be used to obtain the values of power consumption, voltage drop, transition time, and gate delay induced due to voltage drop.

The voltage drop obtained by the above method can be used to design optimal power grids that have less congestion and less chip die area. For this purpose, the method can be incorporated into the standard EDA tools that address these issues.

The supply voltages can also be used to perform Static Timing Analysis (STA) in an accurate manner. STA is a technique of verifying that every signal path in a design meets the required clock-cycle timing, whether or not all of the signal paths are possible. It uses the supply voltages available at the gates, since gate delays depend upon these precise voltages. By using a representative set of applications or maximal vectors, the values of minimum and maximum supply voltages can be obtained for each gate in a circuit design. These values can then be applied for set up checks and hold checks in an STA process.

Figure 4:
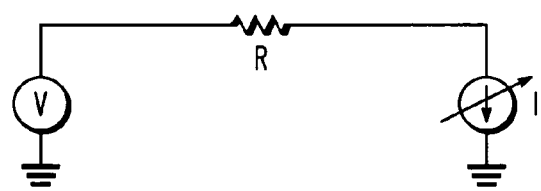
FIG. 4 illustrates a further exemplary logic circuit that has been used to compare the results obtained using the present invention with respect to the results obtained using the conventional approach.

FIG. 4 illustrates another exemplary logic circuit that has been used to compare the results obtained by using the present invention with respect to the results obtained by using the conventional approach. FIG. 4 shows a voltage source V connected to a current sink I, with the help of a wire whose resistance is R. In conventional technologies, the value of current sink I is fixed and it does not change with the voltage drop. However, in the present invention, the current sink I is variable. Assuming, V=1.5 volts, I=100 mA, and R=1 ohm, the values of voltage drops obtained by the conventional approach and the present invention are different. According to the conventional approach, the voltage drop would be 100 mV (v=voltage=100 mA * 1 ohm), whereas, the voltage drop, estimated according to the present invention, would be around 93 mV.

The method provided by the present invention may be implemented by using any of the standard programming languages such as C, C++, C#, JAVA, Microsoft Visual Basic and others.

The present invention may be embodied in any computer-based system. Typical examples of a computer system include a general-purpose computer, a programmed microprocessor, a micro-controller, a peripheral integrated circuit element, and other devices or arrangements of devices that are capable of implementing the steps that constitute the method of the present invention.

While various embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

The invention claimed is:

1. A method for performing voltage drop analysis on a logic circuit, the logic circuit including a plurality of gates, the method comprising:
   generating a polynomial model for power consumption of each gate in the logic circuit;
   generating a polynomial model for delay of each gate in the logic circuit;
   generating a polynomial model for transition time of each gate in the logic circuit;
   determining a supply voltage available at each gate by solving the generated polynomial models of power consumption, delay and transition time for said each gate; and
   determining a voltage drop profile for the logic circuit using the determined supply voltage available at each gate.

2. The method of claim 1, further comprising determining activity information for the logic circuit.

3. The method of claim 1, further comprising determining delay of each of a plurality of cells and interconnects in the logic circuit at an ideal supply voltage.

4. The method of claim 1, further comprising determining parasitic load information for the logic circuit.

5. The method of claim 1, further comprising determining extracted power grid information for the logic circuit.

6. The method of claim 1, further comprising determining standard cell placement information for the logic circuit.

7. The method of claim 1, further comprising:
   determining activity information for the logic circuit;
   determining delay of each of a plurality of cells and interconnects in the logic circuit at an ideal supply voltage;

determining parasitic load information for the logic circuit;

determining extracted power grid information for the logic circuit; and determining standard bell placement information for the logic circuit.

8. The method of claim 1, wherein the generating a polynomial model for power consumption step comprises determining the polynomial model for power consumption as a function of supply voltage, output load and input transition time at each gate.

9. The method of claim 8, wherein a variation of the power consumption with the input transition time is ignored for small changes in the supply voltage in the logic circuit.

10. The method of claim 8, wherein leakage power of the logic circuit is treated as constant.

11. The method of claim 1, wherein the generating a polynomial model for delay step comprises determining the polynomial model for delay as a function of the supply voltage at each gate.

12. The method of claim 11, wherein the generating a polynomial model for delay step further comprises determining small variations in the delay of said each gate due to small variations in supply voltage, ignoring changes in the transition time due to variation in the supply voltage.

13. The method of claim 1, wherein the generating a polynomial model for transition time step comprises determining the polynomial model for the transition time as a function of the supply voltage at each gate.

14. The method of claim 1, wherein the determining a supply voltage step uses a linear dependence of charging and discharging current on the supply voltage.

15. The method of claim 1, further comprising determining the power consumption for each gate of the logic circuit using the determined supply voltage available at said each gate.

16. The method of claim 1, further comprising determining the transition time at inputs of all of the gates in the logic circuit using the determined supply voltages.

17. The method of claim 1, further comprising determining voltage drop induced delay for the logic circuit using the determined supply voltages.

18. The method of claim 1, wherein the voltage drop profile is used by a timing analyzer for performing static timing analysis on the logic circuit.

19. The method of claim 1, wherein the voltage drop profile is used by a power grid analyzer to design a power grid for the logic circuit.

20. A method for performing voltage drop analysis on a logic circuit, including a plurality of gates, the method comprising:

generating a polynomial model for power consumption of each gate in the logic circuit;

generating a polynomial model for transition tine of each gate in the logic circuit;

determining a supply voltage available at each gate of the logic circuit by solving the generated polynomial models of power consumption and transition time for said each gate; and determining a voltage drop profile for the logic circuit using the determined supply voltage available at each gate.

21. A method for performing voltage drop analysis on a logic circuit with a linear solver, the logic circuit including a plurality of gates, the method comprising:

generating a polynomial model for power consumption of each gate in the logic circuit;

generating a polynomial model for transition time of each gate in the logic circuit;

determining a supply voltage available at each gate of the logic circuit using the linear solver to solve the generated polynomial models of power consumption and transition time for said each gate based on a linear dependence of charging and discharging current on the supply voltage available at said each gate; and determining a voltage drop profile for the logic circuit using the determined supply voltage available at each gate.

22. The method of claim 21, wherein current components due to leakage and short circuit power consumption are treated as constants.

* * * * *

UNITED STATES PATENT AND TRADEMARK OFFICE
CERTIFICATE OF CORRECTION

| | | |
|---|---|---|
| PATENT NO. | : 7,240,304 B2 | Page 1 of 1 |
| APPLICATION NO. | : 10/838809 | |
| DATED | : May 4, 2004 | |
| INVENTOR(S) | : Dutta et al. | |

It is certified that error appears in the above-identified patent and that said Letters Patent is hereby corrected as shown below:

In Column 9, Line 5, Claim No. 7:

Change "bell" to --cell--

Signed and Sealed this

Twenty-eighth Day of August, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,240,304 B2 | |
| APPLICATION NO. | : 10/838809 | |
| DATED | : July 3, 2007 | |
| INVENTOR(S) | : Dutta et al. | |

It is certified that error appears in the above-identified patent and that said Letters Patent is hereby corrected as shown below:

In Column 9, Line 5, Claim No. 7:

Change "bell" to --cell--

This certificate supersedes Certificate of Correction issued August 28, 2007.

Signed and Sealed this

Twenty-fifth Day of September, 2007

JON W. DUDAS
*Director of the United States Patent and Trademark Office*